United States Patent
Royer

(10) Patent No.: US 6,961,269 B2
(45) Date of Patent: Nov. 1, 2005

(54) MEMORY DEVICE HAVING DATA PATHS WITH MULTIPLE SPEEDS

(75) Inventor: Roman Royer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 10/608,743

(22) Filed: Jun. 24, 2003

(65) Prior Publication Data

US 2004/0264255 A1 Dec. 30, 2004

(51) Int. Cl.$^7$ ............................................. G11C 16/04
(52) U.S. Cl. .................. 365/189.01; 365/193; 365/201
(58) Field of Search .......................... 365/189.01, 193, 365/201

(56) References Cited

U.S. PATENT DOCUMENTS

| | | | |
|---|---|---|---|
| 5,295,254 A | * | 3/1994 | Ogawa .................. 365/230.03 |
| 5,483,175 A | | 1/1996 | Ahmad et al. ................. 438/18 |
| 5,966,388 A | | 10/1999 | Wright et al. ................ 714/719 |
| 6,678,205 B2 | | 1/2004 | Johnson et al. ............. 365/233 |
| 6,684,356 B2 | | 1/2004 | Raad et al. .................. 714/719 |
| 6,809,990 B2 | * | 10/2004 | Thomann et al. ........... 365/233 |

* cited by examiner

Primary Examiner—Anh Phung
Assistant Examiner—Pho M. Luu
(74) Attorney, Agent, or Firm—Schwegman, Lundberg, Woessner & Kluth, P.A.

(57) ABSTRACT

A memory device has multiple bi-directional data paths. One of the multiple bi-directional data paths is configured to transfer data at one speed. Another one of the multiple bi-directional data paths is configured to transfer data at another speed. The memory device has different modes. Depending on a certain mode, the memory device uses different combinations of the multiple bi-directional data paths to transfer data either at a single speed or at multiple speeds. In some cases, the data represents data information to be stored in memory cells of the memory device. In other cases, the data represents control information and feedback information to be transferred to and from internal circuits, besides the memory cells, of the memory device.

50 Claims, 8 Drawing Sheets

MEMORY DEVICE HAVING DATA PATHS WITH MULTIPLE SPEEDS

FIELD

The present invention relates generally to semiconductor devices, more particularly to data paths in memory devices.

BACKGROUND

Memory devices reside in many computers and electronic products to store data. A typical memory device has a data path and many memory cells. The data path transfers data to and from the memory cells. Typically, the data path is designed to transfer data at a specific speed (frequency). This specific speed is the normal speed.

In some situations, transferring data in a memory device at a speed different from the normal speed is preferable. However, in most memory devices, the data path designed to transfer data at one speed may not transfer data properly at another speed.

Therefore, transferring data in most memory devices at a speed different from the normal speed may result in an improper operation.

SUMMARY OF THE INVENTION

The present invention provides circuits and methods for transferring data in a memory device at different speeds in different situations.

One aspect includes a memory device having a memory array, a first data path, and a second data path. Each of the first and second data paths is a bi-directional data path. The first data path is configured to transfer data to and from the memory array at a first speed. The second data path is configured to transfer data to and from the memory array at a second speed. The memory device also includes a number of transceivers. Each of the transceivers connects to both data paths for transferring data to and from both data paths. The data represent various types of data. In some cases, the data represents data information to be stored in memory cells of the memory device. In some other cases, the data represents control information and feedback information transferred to and from internal circuits of the memory device besides the memory cells.

Another aspect includes a method of transferring data in a semiconductor device. The method includes transferring data in the semiconductor device at a first speed via a first bi-directional data path. The method further includes transferring data in the semiconductor device at a second speed via a second bi-directional data path.

DETAILED DESCRIPTION OF THE EMBODIMENTS

Figure 1:
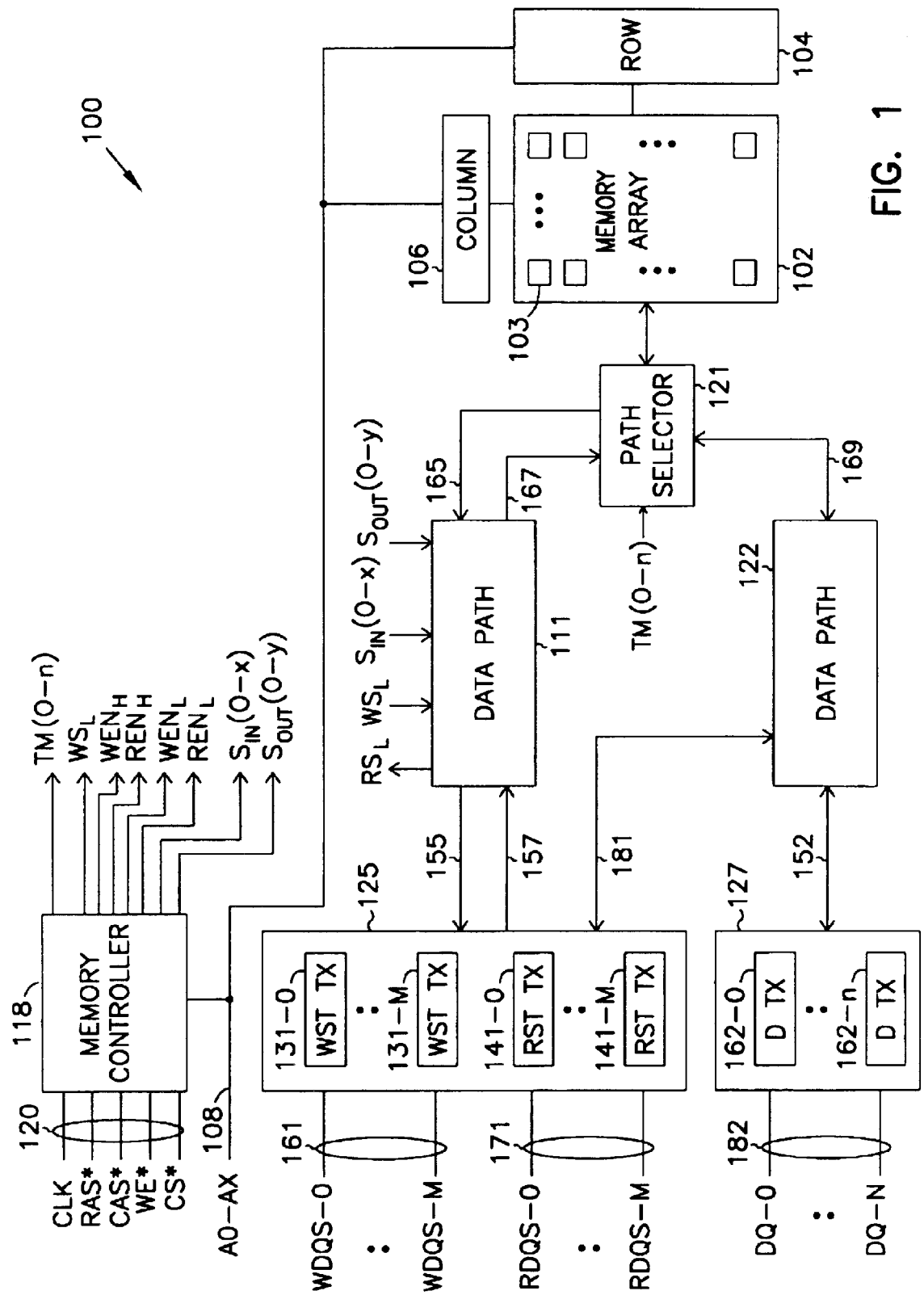
FIG. 1 shows a memory device according to an embodiment of the invention.

The following description and the drawings illustrate specific embodiments of the invention sufficiently to enable those skilled in the art to practice it. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows a memory device according to an embodiment of the invention. Memory device 100 includes a memory array 101 having memory cells 103 arranged in rows and columns. Row and column decoders 104 and 106 provide access to memory cells 103 in response to address signals A0–AX on address lines (bus) 108. A memory controller 118 controls the operations of memory device 100 based on control signals on control lines 120. Examples of control signals include a clock signal CLK, a row access strobe signal RAS*, a column access strobe signal CAS*, a write signal WE*, and a chip select signal CS*.

Memory controller 118 activates certain timing, enable, and select signals during various operations of memory device 100. An example of a timing signal includes the $WS_L$ and $RS_L$ signals. Examples of the enable signals include the TM (0–n), $WEN_H$, $REN_H$, $WEN_L$, and $REN_L$ signals. Examples of the select signals include the $S_{IN}$ (0–X) and $S_{OUT}$ (0–Y) signals. Memory controller 118 activates these timing, enable, and select signals based on a certain combination of the signals on lines 120 and lines 108. The functions of these timing, enable, and select signals are described in connection with subsequent figures.

Memory device 100 further includes two data paths 111 and 122, a path selector 121, a strobe transceiver circuit 125, and a data transceiver circuit 127. Each of the data paths 111 and 122 is a bi-directional data path; it transfers data in both ways: to and from memory array 102. Path selector 121 selects which one of the data paths 111 and 122 to transfer data based on a certain combination of the TM (0–n) signals. Path selector 121 connects to data path 111 via lines 165 and lines 167 and also to data path 122 via lines 169. For simplicity, in FIG. 1, some of the single lines represent a group of lines. For example, each of the lines 155, 157, 181, 152, 165, 167, and 169 represents a group of parallel lines.

Strobe transceiver circuit 125 includes write strobe transceivers (WST TX) 131 (131-0 to 131-M) and read strobe transceivers (RST TX) 141 (141-0 to 141-M). Write and read strobe transceivers 131 and 141 are bi-directional circuits; they transfer data in both directions. These transceivers transfer data represented by signals WDQS (0–M) and RDQS (0–M) to and from data paths 111 and 122. Lines 155 and 157 carry data transferred between strobe transceiver circuit 125 and data path 111. Lines 181 carry data transferred between strobe transceiver circuit 125 and data path 122.

Data transceiver circuit 127 includes data transceivers (D TX) 162 (162-0 to 162-N). Data transceivers 162 are bi-directional circuits; they transfer data in both directions. Data transceivers 162 transfer data represented by signals DQ (0–N) to and from data path 122. Lines 152 carry data transferred between data transceiver circuit 127 and data path 122.

Lines 161, 171, and 182 correspond to external terminals or connections of memory device 100. In some embodiments, lines 161, 171, and 182 correspond to pins or solder balls on a packaged integrated circuit of memory device 100. In other embodiments, lines 161, 171, and 182 correspond to pads on a packaged integrated circuit die of memory device 100.

In some embodiments, each of the write strobe transceivers 131, each of the read strobe transceivers 141, and each of the data transceivers 162 have equal number of elements. In other embodiments, for each element in a transceiver of the transceivers 131, 141, and 162, there is an identical element in each of the other transceivers. Thus, in these other embodiments, each of the write strobe transceivers 131, each of the read strobe transceivers 141, and each of the data transceivers 162 have matched elements. In some other embodiments, each of the write strobe transceivers 131, each of the read strobe transceivers 141, and each of the data transceivers 162 have equal number of elements and the elements are matched.

Equal number of matched elements of transceivers within a transceiver group balances the loads between the transceivers within the transceiver group. Equal number of matched elements of transceivers among different transceiver groups balances the loads among the transceivers of different groups. Balanced loadings within the same transceiver group and among different transceiver groups reduce variation among signals transferred to and from the transceivers, leading to improved performance of the memory device.

Memory device 100 can be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), and Rambus DRAMs. Memory device 100 can also be a static random access memory (SRAM) device, or can be a flash memory. Memory device 100 includes other elements, which are not shown for clarity.

Memory device 100 writes data to memory array 102 in a write operation and reads data from memory array 102 in a read operation. Memory device 100 has multiple modes including a test mode and a normal mode. The write operation can be performed either in the test mode or in the normal mode.

The test mode is a mode in which memory device 100 is put under a test usually during manufacturing of memory device 100. The normal mode is a mode in which memory device 100 is not put under a test. An example in a normal mode includes a mode when memory device 100 is used by an end-user. The test mode and the normal mode are selected by a certain combination of the signals on lines 120 and 108. For example, one combination of the signals on lines 120 and 108 selects the test mode and another combination of these signals selects the normal mode.

Memory device 100 operates at multiple speeds. In some embodiments, the speed of memory device 100 is the speed (frequency) of the CLK signal. Thus, in these embodiments, the multiple speeds of memory device 100 include the different speeds of the CLK signal. In some embodiments, the multiple speeds include a first speed and a second speed unequal to the first speed. For memory device 100 to operate at the first speed, the CLK signal provided to memory device 100 is set at the first speed; and for memory device 100 to operate at the second speed, the CLK signal is set at the second speed. In some embodiments, the first speed is a low speed and the second speed a high speed; the low speed is lower than the high speed.

In some embodiments, memory device 100 operates at a speed different from the speed of the CLK signal without resetting or changing the speed of the CLK signal. In these embodiments, memory device 100 includes circuits to internally modify the frequency of the CLK signal. The circuits may include a frequency multiplier, or a frequency divider, or both. The frequency multiplier multiplies the frequency of the CLK signal to generate an internal clock signal having a frequency higher than the frequency of the CLK signal. Memory device 100 uses this internal clock signal when it operates at a speed higher than the speed of the CLK signal. The frequency divider divides the frequency of the CLK signal to generate an internal clock signal having a frequency lower than the frequency of the CLK signal. Memory device 100 uses this internal clock signal when it operates at a speed lower than the speed of the CLK signal.

Memory device 100 can operate at the multiple speeds in the test mode and at a single speed in either the test mode or the normal mode. For example, memory device 100 can perform the write and read operations either at the low speed or at the high speed in the test mode and at the high speed in the normal mode. Memory device 100 uses many combinations of data paths 111 and 122 to transfer data to and from memory array 102.

Data path 111 and 122 are configured to transfer data at multiple speeds. In some embodiments, data path 111 is configured to transfer data at the first speed and data path 122 is configured to transfer data at the second speed. In some embodiments, memory device 100 uses data paths 111 and 122 for transferring data at a single speed in both the write and read operations. For example, memory device 100 uses data path 111 for transferring data at the low speed in both write and read operations in the test mode, and uses data path 122 for transferring data at the high speed in both write and read operations in the normal mode. Thus, in both write and read operations in this example, data transferred in data path 111 in the test mode is slower than data transferred in data path 122 in the normal mode.

In other embodiments, in the test mode, memory device 100 uses data paths 111 and 122 for transferring data at multiple speeds. For example, memory device 100 uses data path 111 for transferring data at the low speed in the write operation and uses data path 122 for transferring data at the high speed in the read operation. Thus, in this example, in the test mode, data transferred in the write operation in data path 111 is slower than data transferred in the read operation in data path 122.

As another example, in the test mode, memory device 100 uses data path 111 for transferring data at the low speed in the read operation and uses data path 122 for transferring data at the high speed in the write operation. Thus, in this example, in the test mode, data transferred in the write operation in data path 122 is faster than data transferred in the read operation in data path 111.

In some other embodiments, in the same test mode, memory device 100 uses data path 111 for transferring data in a first write and read operations at one speed and uses data path 122 for transferring data in a second write and read operations at another speed. For example, in the same test mode, memory device 100 uses data path 111 for transferring data in a first write and read operations at the low speed and uses data path 122 for transferring data in a second write and read operations at the high speed.

Since data path 111 can be configured to operate at a speed lower than the speed of data path 122, in some cases such as during the test mode, using data path 111 instead of data path 122 for transferring data allows for flexibility for controlling and analyzing data during the test mode.

In this description, data and data signal are used interchangeably. Data (or data signal) represents various types of data including data information and timing information. Thus, in one instance, data may represent data information and in another instance, data may represent timing information. Examples of data information include bit values such as logic one and logic zero representing values of bits of data transferred to and from memory cells 103 of memory array 102. Other examples of data information include certain status values of internal circuits of memory device 100. Examples of timing information include signals such as clock signals, strobe signals, and other timing signals representing time for starting and stopping certain data transfers or certain operations.

Also in this description, a low speed operation refers to an operation in which memory device 100 performs a certain operation at the low speed; and a high speed operation refers to the operation in which memory device 100 performs a certain operation at the high speed.

The WDQS (0–M) signals represent both data information and timing information. For example, in a low speed read operation, the WDQS (0–M) signals represent data information outputted from data path 111, and in a high speed write operation, the WDQS (0–M) signals represent timing information of data signals DQ (0–N) inputted to data path 122.

The RDQS (0–M) signals also represent both data information and timing information. For example, in a low speed write operation, the RDQS (0–M) signals represent data information to be transferred to data path 111, and in a high speed read operation, the RDQS (0–M) signals represent timing information of the DQ (0–N) signals outputted from data path 122.

Figure 2:
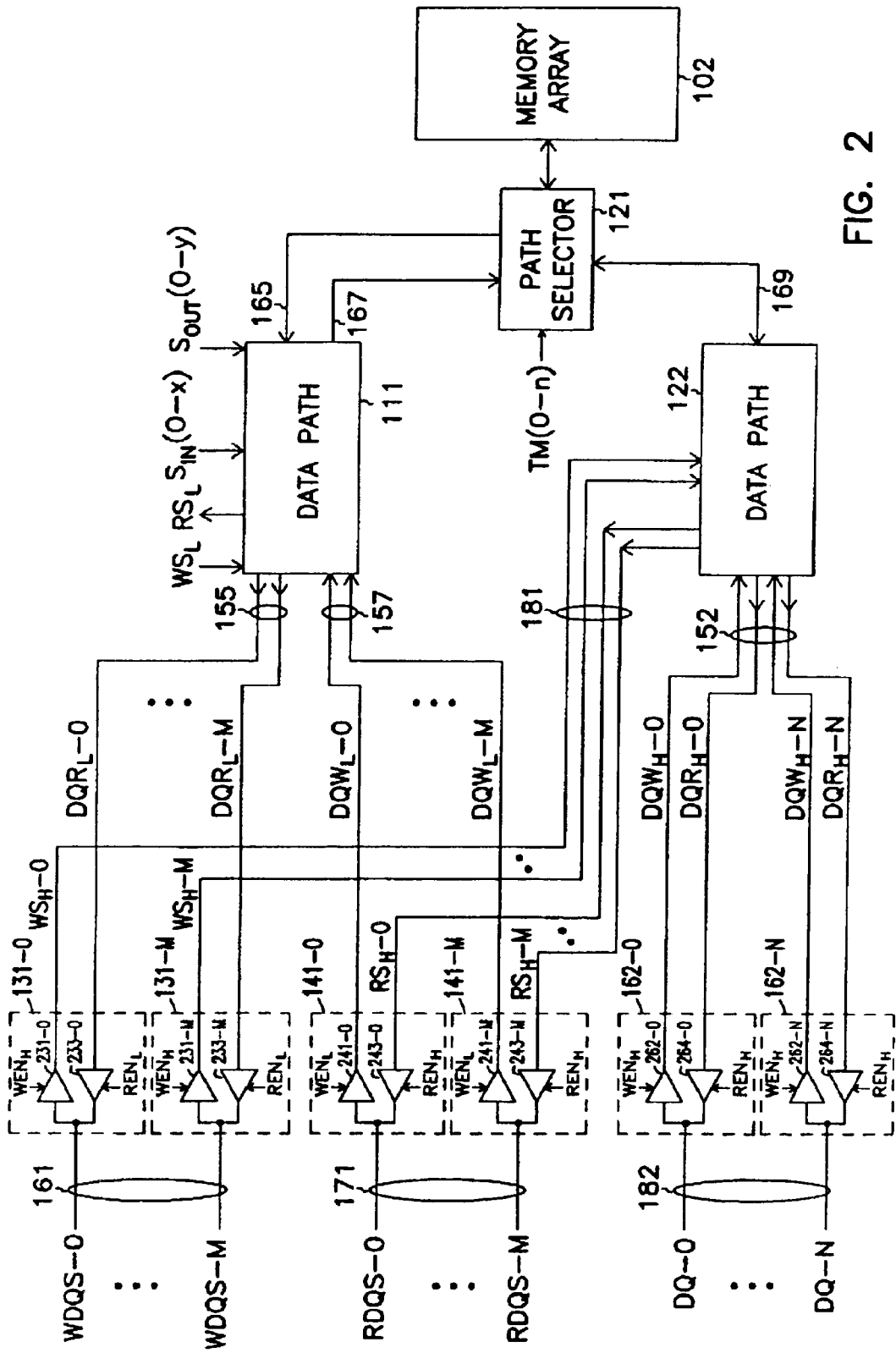
FIG. 2 shows more detail of a portion of the memory device of FIG. 1.

FIG. 2 shows more detail of a portion of the memory of FIG. 1. Write strobe transceivers 131 have a number of input circuits 213 (213-0 to 213-M) and output circuits 233 (233-0 to 233-M). Each of the write strobe transceivers 131 has a pair of input and output circuits connected to each other and also connected to both data paths 111 and 122. For example, write strobe transceiver 131-0 has an input circuit 231-0 and an output circuit 233-0 connected to each other at one of the lines 161. Input circuit 231-0 also connects to data path 111 and output circuit 233-0 also connected to data path 122.

Read strobe transceivers 141 (141-0 to 141-M) have a number of input circuits 241 (241-0 to 241-M) and output circuits 243 (243-0 to 243-M). Each of the read strobe transceivers 141 has a pair of input and output circuits connected to each other and also connected to both data paths 111 and 122. For example, read strobe transceiver 141-0 has an input circuit 241-0 and an output circuit 243-0 connected to each other at one of the lines 171. Input circuit 241-0 also connects to data path 111 and an output circuit 243-0 also connects to data path 122.

Data strobe transceivers 162 (162-0 to 162-N) have a number of input circuits 262 (262-0 to 262-M) and output circuits 264 (264-0 to 264-N). Each of the data strobe transceivers 162 has a pair of input and output circuit connected to each other and also connected to data path 122. For example, data transceiver 162-0 has an input circuit 262-0 and an output circuit 264-0 connected to each other at one of the lines 182 and also connected to data path 122.

In some embodiments, input circuits 231, 241, and 262 are identical and output circuits 233, 243, and 264 are identical.

Write and read strobe transceivers 131 and 141 have dual functions: transferring data between data path 111 and lines 161 and 171 in one operation and transferring data between data path 122 and lines 161 and 171 in another operation. Since data path 111 and 122 have different speeds, write and read strobe transceivers 131 and 141 transfer data to and from data path 111 at one speed and transferring data to and from data path 122 at another speed.

Input circuits 231 of the write strobe transceivers 131 provide input data to data path 122. Input circuit 241 of the read strobe transceivers provide input data to data path 111. Memory device 100 uses the input circuits 231 and 241 in different operations. For example, memory device 100 uses input circuits 231 to provide signals $WS_H$ (0–M) to data path 122 during a high speed write operation, and uses input circuits 241 to provide signals $DQW_L$ (0–M) to data path 111 in a low speed write operation. The $WS_H$ (0–M) signals are high speed write strobe signals. The $DQW_L$ (0–M) signals are low speed write data signals.

Output circuits 233 of the write strobe transceivers 131 receive data outputted from data path 111. Output circuits 243 of the read strobe transceivers 141 receive data outputted from data path 122. Memory device 100 uses output circuits 233 and 243 in different operations. For example, memory device 100 uses output circuits 233 to receive signals $DQR_L$ (0–M) from data path 111 in a low speed read operation, and uses output circuits 243 to receive signals $RS_H$ (0–M) from data path 122 during a high speed read operation. The $RS_H$ (0–M) signals are high speed read strobe signals. The $DQR_L$ (0–M) signals- are low speed read data signals.

The WDQS (0–M) signals and the $WS_H$ (0–M) signals are the same signals in one operation and the WDQS (0–M) signals and the $DQR_L$ (0 M) signals are the same signals in another operation. For example, when memory device 100 performs a high speed write operation, the $WS_H$ (0–M) transferred to data path 122 signals are the WDQS (0–M) signals inputted at lines 161. When memory device 100 performs a low speed read operation, the WDQS (0–M) signals are the $DQR_L$ (0–M) signals provided by data path 111.

The RDQS (0–M) signals and the $RS_H$ (0–M) signals are the same signals in one operation and the RDQS (0–M) signals and the $DQW_L$ (0 M) signals are the same signals in another operation. For example, when memory device 100 performs a high speed read operation, the RDQS (0–M) signals are the $RS_H$ (0–M) signals provided by the data path 122. When memory device 100 performs a low speed write operation, the $DQW_L$ (0–M) signals transferred to data path 111 are the RDQ (0–M) signals inputted at lines 171.

In data transceivers 162, input circuits 262 provide data to data path 122 and output circuits 264 receive data outputted from data path 122. Memory device 100 uses input and output circuits 262 and 264 in different operations. For example, memory device 100 uses input circuits 262 to provide signals $DQW_H$ (0–N) to data path 122 during a high speed write operation, and uses output circuits 264 to receive signals $DQR_H$ (0–N) outputted from data path 122 during a high speed read operation. The $DQW_H$ (0–N) signals are high speed write data signals. The $DQR_H$ (0–N) signals are high speed read data signals.

The DQ (0–N) signals and the $DQW_H$ (0–N) signals are the same signals in one operation and the DQ (0–N) signals and the $DQR_H$ (0–N) signals are the same signals in another operation. For example, when memory device 100 performs a high speed write operation, the $DQW_H$ (0–N) signals transferred to data path 122 are the DQ (0–N) signals inputted at lines 162. When memory device 100 performs a high speed read operation, DQ (0–N) signals are the $DQR_H$ (0–N) signals provided by data path 122.

The $WS_L$ signal is a low speed write strobe signal. In some embodiments, the $WS_L$ represent a plurality of low speed write strobe signals. Memory controller 118 activates the $WS_L$ signal during a low speed write operation. The $WS_L$ signal carries timing information of the RDQS (0–M) signals during the low speed write operation. This timing information allows data represented by the RDQS (0–M) signals to be accurately transferred to data path 111 during the low speed write operation.

The $RS_L$ signal is a low speed read strobe signal. In some embodiments, the $RS_L$ signal represents a plurality of low speed read strobe signals. Memory controller 118 activates the $RS_L$ signal during a low speed read operation. The $RS_L$ signal carries timing information of the WDQS (0–M) signals during a low speed read operation. This timing information allows data represented by the WDQS (0–M) signals to be accurately transferred from data path 111 during the low speed read operation. The $WS_L$ and $RS_L$ signals are generated from the clock signal CLK (FIG. 1). In some embodiments, the $RS_L$ signal can be provided to a pin (pad) of memory device 100 in which the $RS_L$ signal may be in phase with the CLK signal. In other embodiments, the $RS_L$ signal is omitted and the CLK signal can be used to carry the timing information of the WDQS (0–M) signals during a low speed read operation.

The WDQS (0–M) signals carry timing information of data signals DQ (0–N) signals during a high speed write operation. This timing information allows data represented by the DQ (0–N) signals to be accurately transferred to data path 122 during the high speed write operation. During a low speed read operation, the WDQS (0–M) signals carry data information outputted by data path 111.

The RDQS (0–M) signals carry timing information of data signals DQ (0–N) during a high speed read operation. This timing information allows data represented by the DQ (0–N) signals to be accurately transferred from data path 122 during the high speed read operation. During a low speed write operation, the RDQS (0–M) signals carry data information to be transferred to data path 111.

The enable signals $WEN_H$, $REN_H$, $WEN_L$, and $REN_L$, generated by memory controller 118 (FIG. 1), control the input and output circuits of write strobe transceivers 131, read strobe transceivers 141, and data transceivers 162. Memory controller 118 activates these enable signals at a certain time based on a particular operation and a particular speed of memory device 100.

The $WEN_H$ signal is a high speed write enable signal. The $REN_H$ signal is a high speed read enable signal. Memory controller 118 activates the $WEN_H$ and $REN_H$ signals during a high speed operation.

The $WEN_L$ signal is a low speed write enable signal $WEN_L$. The $REN_L$ signal is a low speed read enable signal. Memory controller 118 activates the $WEN_L$ and $REN_L$ signals during a low speed operation.

Figure 3:
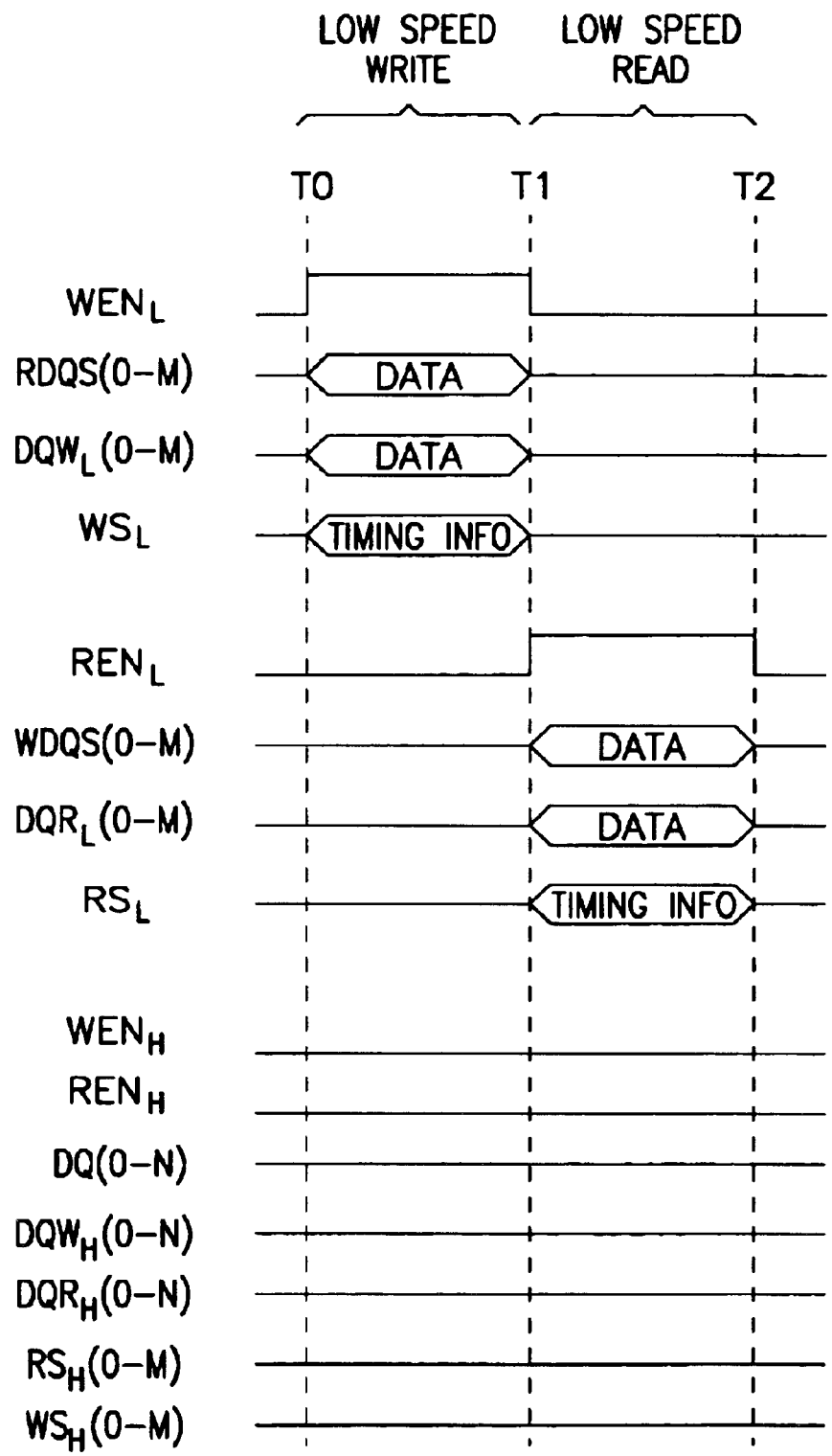
FIG. 3 is a timing diagram showing an example of a low speed write operation and a low speed read operation of the memory device of FIG. 1

FIG. 3 is a timing diagram showing an example of a low speed write operation and a low speed read operation of the memory device 100. The low speed write operation occurs between times T0 and T1 and low speed read operation occurs between times T1 and T2. In FIG. 3 and also in FIG. 4 through FIG. 6, DATA represents data (data information) and TIMING INFO represents timing information of the corresponding DATA. For example, between times T0 and T1, the RDQS (0–M) signals carry data information indicated by DATA and the $WS_L$ signal carries timing information indicated by TIMING INFO. This TIMING INFO carried by the $WS_L$ is the timing information corresponding to the DATA carried by the RDQS (0–M) signals.

Between times T0 and T1, the RDQS (0–M) signals represent input data. These input data are transferred to data path 111 (FIG. 2) as the $DQW_L$ (0–M) signals. The low speed write signal $WEN_L$ is activated (enabled or HIGH) to allow input circuits 241 (FIG. 2) of read strobe transceivers 141 to transfer data to data path 111. The low speed read signal $REN_L$ is deactivated (disabled or LOW) to deactivate output circuits 233 and no data or timing information are carried by the WDQS (0–M), $DQR_L$ (0–M), and the $RS_L$ signals. The high speed write and read signals $WEN_H$ and $REN_H$ are deactivated (LOW). Thus, input and output circuits 231, 243, 262, and 264 controlled by these signals are deactivated and no data or timing information are transferred through these input and output circuits. FIG. 3 shows that the DQ (0–N), $DQW_H$ (0–M), $DQR_H$ (0–M), $WS_H$ (0–M), and $RS_H$ (0–M) signals carry no data or timing information.

Between times T1 and T2, the WDQS (0–M) signals represent output data. These output data are transferred from data path 111 (FIG. 2) by the $DQR_L$ (0–M) signals. The low speed read $REN_L$ signal is activated (HIGH) to allow output circuits 233 (FIG. 2) of write strobe transceivers 131 to transfer data from data path 111 to lines 161. The $REN_L$ signal is deactivated (LOW) to deactivate output circuits 241 and no data or timing information are carried by the RDQS (0–M), $DQW_L$ (0–M), and the $WS_L$ signals. The high speed signals remain at their previous states. In the low speed write and read operations, no data is transferred between any transceiver and data path 122.

Figure 4:
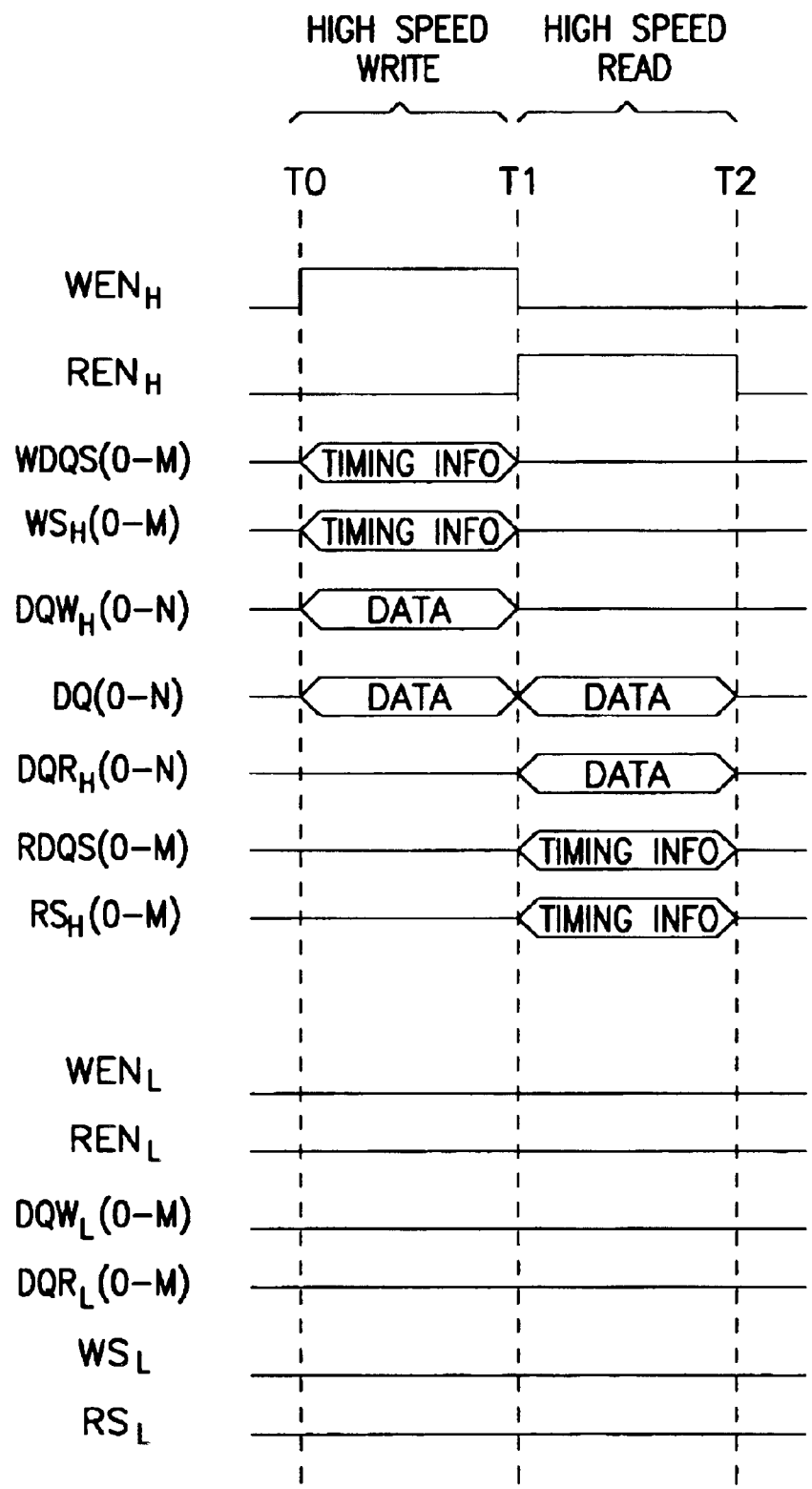
FIG. 4 is a timing diagram showing an example of a high speed write operation and a high speed read operation of the memory device of FIG. 1.

FIG. 4 is a timing diagram showing an example of a high speed write operation and a high speed read operation of the memory device 100. The high speed write operation occurs between times T0 and T1. The high speed read operation occurs between times T1 and T2.

Between times T0 and T1, the DQ (0–N) signals represent input data. These input data are transferred to data path 122 (FIG. 2) as the $DQW_H$ (0–N) signals. The $WS_H$ (0–M) signals are the same as the WDQS (0–M) signals and are carry timing information of the DQ (0–N) signals. The high speed write $WEN_H$ signal is activated to allow input circuits 231 (FIG. 2) of write strobe transceivers 131 to transfer the timing information to data path 122. The high speed read signal $REN_H$ is deactivated (LOW) to deactivate output circuits 243 and 264 and no data or timing information are carried by the RDQS (0–M), $DQR_H$ (0–N), and the $RS_H$ (0–M) signals. The low speed write and read signals $WEN_L$ and $REN_L$ are deactivated (LOW). Thus, input and output circuits 233, 241, and 243 controlled by these signals are deactivated and no data or timing information are transferred through these input and output circuits. FIG. 4 shows that the RDQS (0–M), $DQW_L$ (0–M), $DQR_L$ (0–M), $WS_L$, and $RS_L$ signals carry no data or timing information.

Between times T1 and T2, the DQ (0–N) signals represent output data. These output data are transferred from data path 122 (FIG. 2) by the $DQR_H$ (0–N) signals. The RDQS (0–M) signals are the same as the $RS_H$ (0–M) signals and are carry timing information of the DQ (0–N) signals. The high speed read $REN_H$ signal is activated to allow output circuits 243 (FIG. 2) of read strobe transceivers 131 to transfer the timing information to lines 171. The high speed write signal $WEN_H$ is deactivated (LOW) to deactivate input circuits 231 and 262 and no data or timing information are carried by the WDQS (0–M), $DQW_H$ (0–N), and the $WS_H$ (0–M) signals. The low speed signals remains at their previous states. In the high speed write and read operations, no data is transferred between any transceivers and data path 111.

Figure 5:
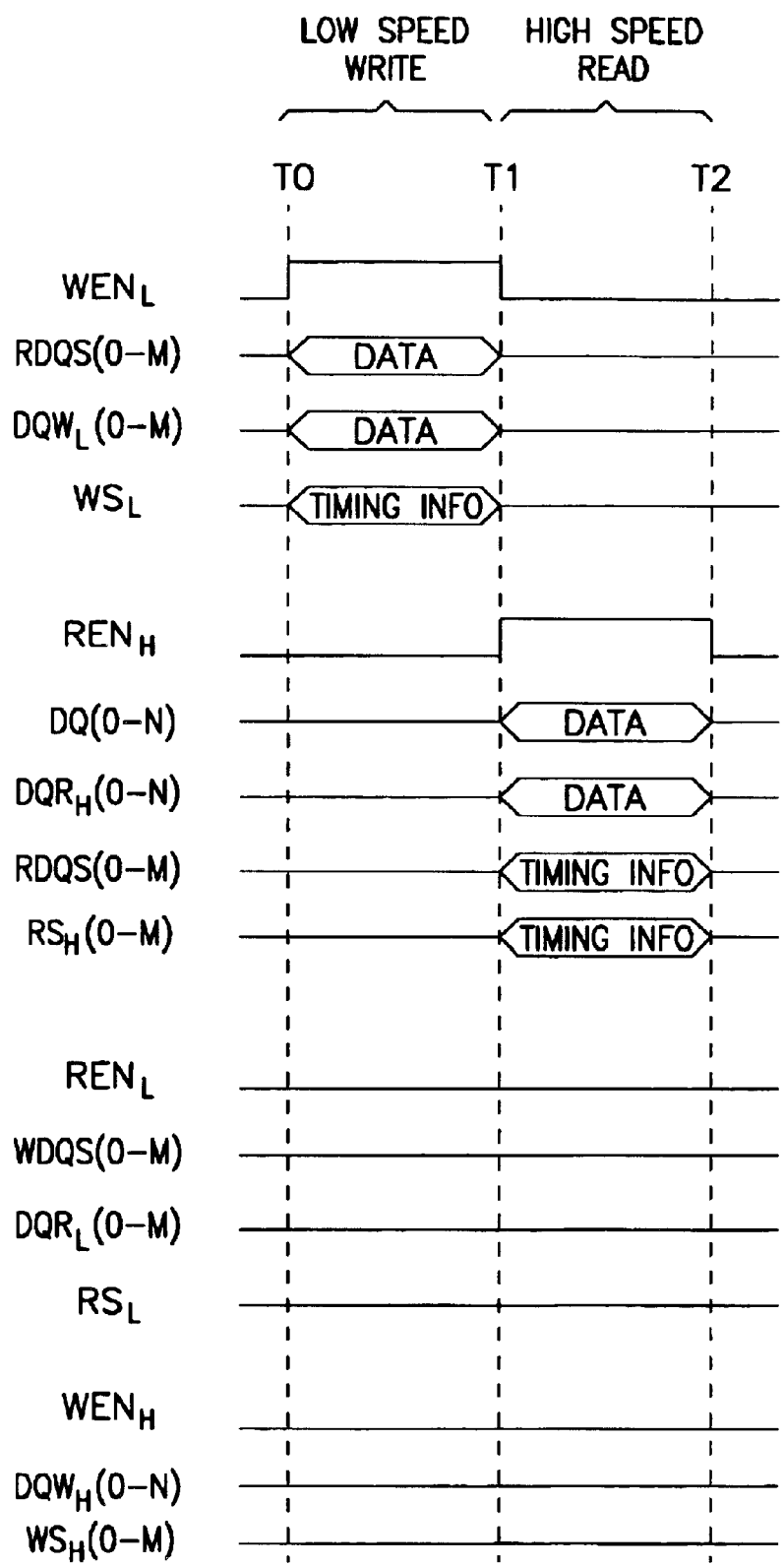
FIG. 5 is a timing diagram showing an example of a low speed write operation and a high speed read operation of the memory device of FIG. 1.
Figure 6:
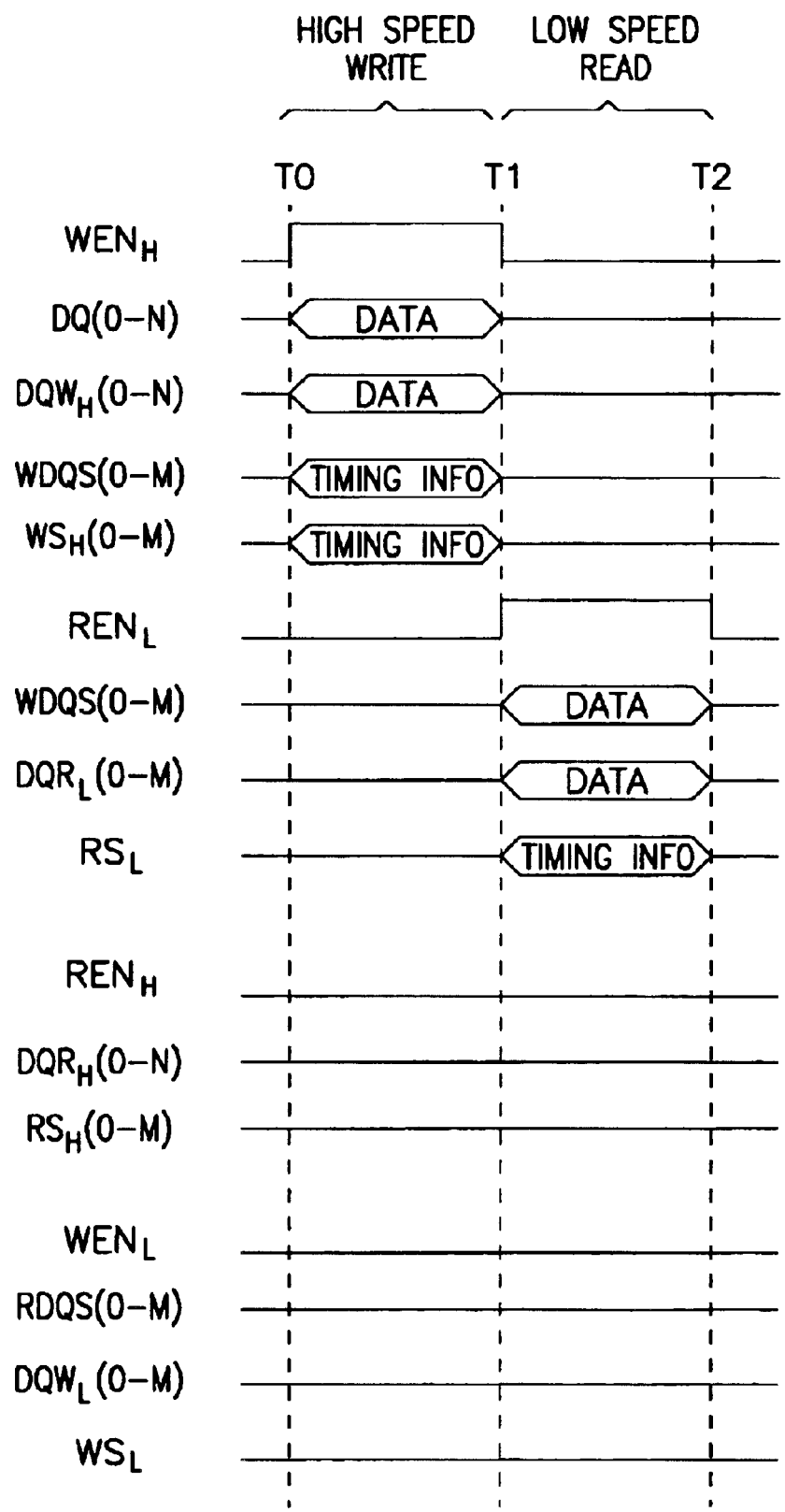
FIG. 6 is a timing diagram showing an example of a high speed write operation and a low speed read operation of the memory device of FIG. 1.

FIG. 5 and FIG. 6 show other combinations of the write and read operations of the memory device 100.

FIG. 5 is a timing diagram showing an example of a low speed write operation and a high speed read operation of the memory device 100. The low speed write operation occurs between times T0 and T1 and is similar to the low speed write operation of FIG. 3. The high speed read operation occurs between times T1 and T2 and is similar to the high speed read operation of FIG. 4. In some embodiments, memory device 100 performs the operations described in FIG. 5 in a reverse fashion: the low speed write operation is performed between times T1 and T2 and the high speed read operation is performed between times T0 and T1.

FIG. 6 is a timing diagram showing an example of a high speed write operation and a low speed read operation of the memory device 100. The high speed write operation occurs between times T0 and T1 and is similar to the high speed write operation described in FIG. 4. The low speed read operation occurs between times T1 and T2 and is similar to the low speed read operation described in FIG. 3. In some embodiments, memory device 100 performs the operations described in FIG. 6 in a reverse fashion: the high speed write operation is performed between times T1 and T2 and the low speed read operation is performed between times T0 and T1.

Figure 7:
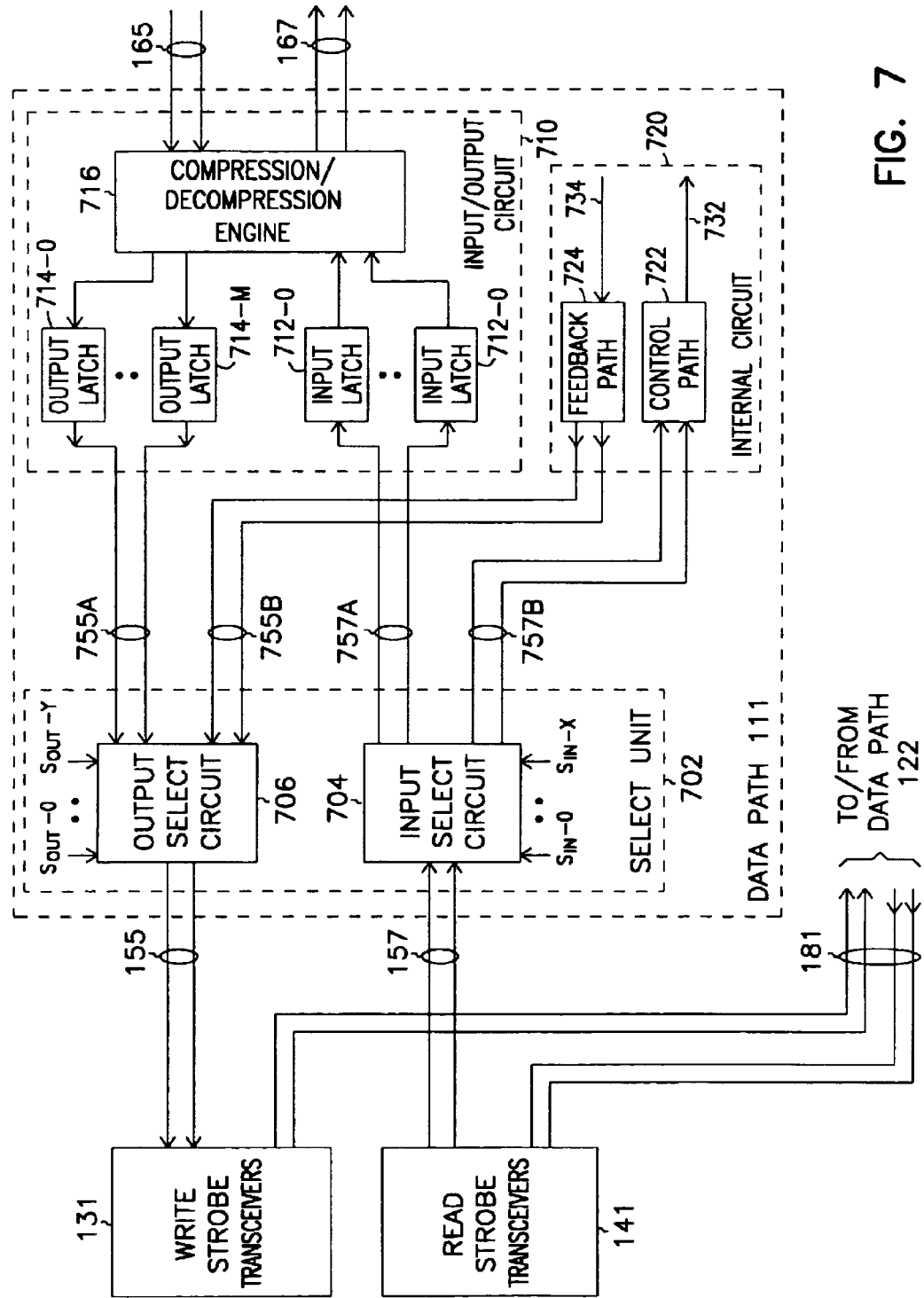
FIG. 7 is a block diagram of a data path the memory device of FIG. 1.

FIG. 7 is block diagram of data path 111 of memory device 100. Data path 111 includes a select unit 702 connected to an input/output circuit 710 and an internal circuit 720. Input/output circuit 710 transfers data to and from memory cells 103 (FIG. 1). Based on select signals $S_{IN}$ (0–X) and $S_{OUT}$ (0–Y), select circuit 702 selects one route from among multiple routes to transfer data. The multiple routes include a route between strobe transceivers 131 and 141 and input/output circuit 702 and a route between strobe transceivers 131 and 141 and internal circuit 720. Internal circuit 720 represents other circuits of memory device 100 besides memory cells of memory array 102. In embodiments represented by FIG. 7, internal circuit 720 is shown as a part of data path 111. However, in other embodiments, internal circuit 720 can be outside of data path 111 and can be located anywhere within memory device 100.

Select unit 702 has an input select circuit 704 and an output select circuit 706. In some embodiments, each of the input and output select circuits 704 and 706 has multiplexing circuitry and decoding circuitry for selecting among the multiple routes. Input select circuit 704 transfers data from lines 157 to one of the lines 757A and lines 757B based on input select signals $S_{IN}$ (0–X). Output select circuit 706 transfers data from one of the lines 755A and 755B to lines 155 based on output select signals $S_{OUT}$ (0–Y). Data on lines 155 and lines 157 are the data transferred to and from write and read strobe transceivers 131 and 141 (FIG. 2).

Input/output circuit 710 includes a number of input latches 712 (712-0 to 712-M) for receiving data from lines 757A and a number of output latches 714-0 to 714-M (714) for outputting data to lines 755A. A compression and decompression (C/D) engine 716 connects to latches 712 and 714 for compressing and decompressing data. In some embodiments, C/D engine 716 decompresses data received from input latches 712 before transferring the data to lines 167 and compresses data received from lines 165 before transferring the data to output latches 714. Data on lines 165 and 167 are the data transferred to and from memory array 102 (FIG. 2). The C/D engine 716 can be activated and deactivated by applying certain combination of signals on lines 120 and 108 (FIG. 1).

In some embodiments, C/D engine 716 is omitted and no data is decompressed during transfer between input latches 712 and lines 167 and no data is compressed during transfer between output latches 714 and lines 165.

In other embodiments, C/D engine 716 can be replaced by circuits for operating on data transferred between input latches 712 and lines 167 and between output latches 174 and line 165. For example, C/D engine 716 can be replaced by an encryption and decryption engine to encrypt and decrypt data transferred between input latches 712 and lines 167 and between output latches 174 and lines 165. The encryption and decryption engine can be activated and deactivated by applying certain combination of signals on lines 120 and 108 (FIG. 1). In some other embodiments, C/D engine 716 can be replaced by a coding and decoding (CODEC) circuit for coding and decoding data transferred between input latches 712 and lines 167 and between output latches 174 and lines 165. The CODEC circuit can be activated and deactivated by applying certain combination of signals on lines 120 and 108 (FIG. 1).

Internal circuit 720 includes a control path 722 and a feedback path 724. Control path 722 provides control data (signals) on lines 757B to internal circuit 720 via lines 732. Feedback path 722 provides feedback data via lines 734 from internal circuit 720 to lines 755B. For example, during a certain mode such as a test mode, input select circuit 704 selects lines 757B to transfer the control data provided by read transceivers 141. Control path 722 transfers the control data on lines 757B to control internal circuit 720 during the test mode. As another example, during a certain mode such as a test mode, output select circuit 706 selects lines 755B to transfer feedback data provided by feedback path 724 collected from internal circuits 720. The feedback data may include data representing certain values of the internal circuits of memory device 100. Write strobe transceivers 131 receive the feedback data for analysis to determine the performance of the internal circuits, or the performance of the entire memory device 100.

A different combination of the $S_{IN}$ (0–X) and $S_{OUT}$ (0–Y) signals selects a different route for transferring data between one of the transceivers 131 and 141 and one of the circuits 710 and 720. In some embodiments, memory controller 120 chooses a certain combination of the $S_{IN}$ (0–X) and $S_{OUT}$ (0–Y) signals based on the signals on lines 120 and lines 108 (FIG. 1).

A first combination of the $S_{IN}$ (0–X) and $S_{OUT}$ (0–Y) signals selects a route between read strobe transceivers 141 and input/output circuit 710. In some embodiments, the first combination of the $S_{IN}$ (0–X) and $S_{OUT}$ (0–Y) signals occurs during a low speed write operation in which data from read strobe transceivers 141 are written to memory array 102 via a route having elements connected by lines 157, 757A, and 167.

A second combination of the $S_{IN}$ (0–X) and $S_{OUT}$ (0–Y) signals selects a route between read strobe transceivers 141 and internal circuit 720. In some embodiments, the second combination of the $S_{IN}$ (0–X) and $S_{OUT}$ (0–Y) signals occurs during a low speed write operation in which control data from read strobe transceivers 141 are transferred to control path 722 of internal circuit 720 via a route having elements connected by lines 157 and 757B.

A third combination of the $S_{IN}$ (0–X) and $S_{OUT}$ (0–Y) signals selects a route between write strobe transceivers 131 and input/output circuit 710. In some embodiments, the third combination of the $S_{IN}$ (0–X) and $S_{OUT}$ (0–Y) signals occurs during a low speed read operation in which data from memory array 102 are read to write strobe transceivers 131 via a route having elements connected by lines 165, 755A, and 155.

A fourth combination of the $S_{IN}$ (0–X) and $S_{OUT}$ (0–Y) signals selects a route between write strobe transceivers 141 and internal circuit 720. In some embodiments, the fourth combination of the $S_{IN}$ (0–X) and $S_{OUT}$ (0–Y) signals occurs during a low speed read operation in which data from feedback path 724 of internal circuit 720 are transferred to write strobe transceivers 131 via a route having elements connected by lines 755B and 155.

Other combinations of the $S_{IN}$ (0–X) and $S_{OUT}$ (0–Y) signals deactivate input and output select circuits 704 and 706 and no data is transferred between write and read strobe transceivers 131 and 141 and data path 111.

In some other embodiments, a certain combination of the $S_{IN}$ (0–X) and $S_{OUT}$ (0–Y) signals causes data to be transferred only between write and read strobe transceivers 131 and 141 and data path 122 via lines 181.

In some embodiments, data path 122 includes elements similar to the elements of data path 111 shown in FIG. 7. In some of these embodiments, data paths 111 and 122 are configured differently to transfer data at different speeds. Data path 111 and 122 can be configured by constructing data path 111 with elements that operate properly at one speed and data path 122 with elements that operate properly at another speed. For example, one method to configure data path 111 involves constructing elements of data path 111, such as input latches 712 and output latches 714, to operate at a first speed. One method to configure data path 122 involves constructing elements of data path 122, such as elements that are similar to latches 712 and 714, to operate at a second speed. In some embodiments, the first speed is lower than the second speed and the second speed is designated as the normal speed. In some of these embodiments, the normal speed is the maximum speed at which memory device 100 operates properly.

Configuring data paths 111 and 122 with different speeds allows options for memory device to transfer data at multiple speeds in different situations. For example, data path 111 can be used for transferring data at a speed lower than the normal speed in a test; and data path 122 can be used for transferring data at the normal speed either in a test mode or in the normal mode in which the memory device is used by and end-user.

Figure 8:
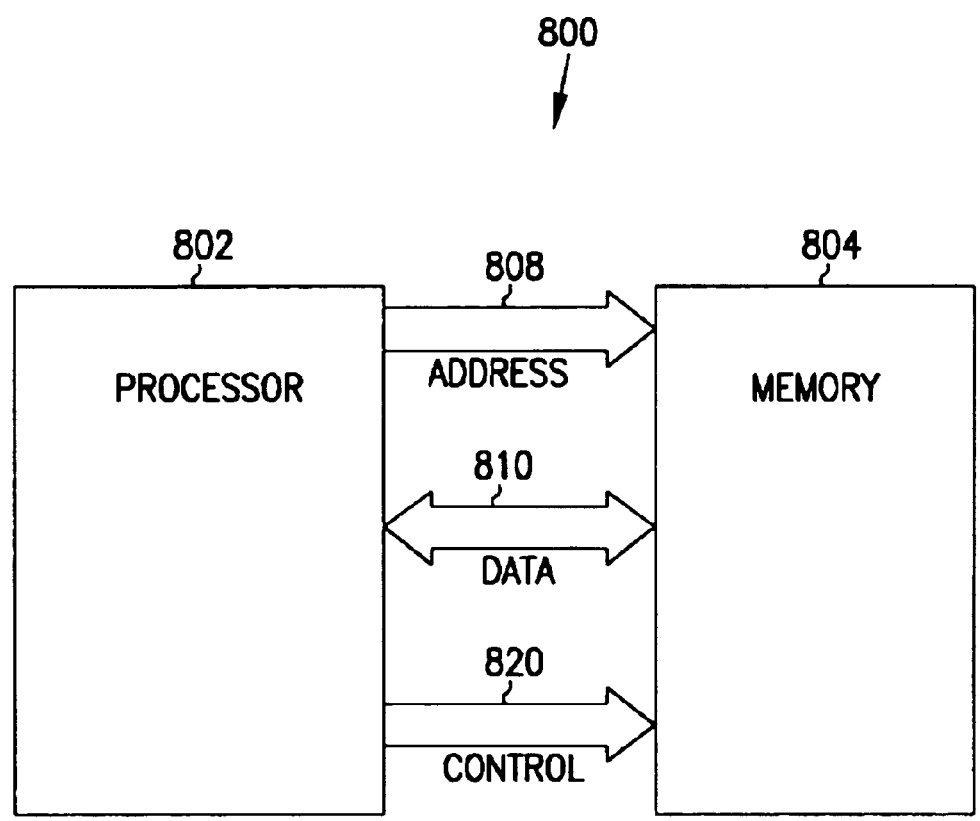
FIG. 8 shows a system according to an embodiment of the invention.

FIG. 8 shows a system according to an embodiment of the invention. System 800 includes a first integrated circuit (IC) 802 and a second IC 804. ICs 802 and 804 include semiconductor devices. In some embodiments, ICs 802 and 804 include processors, controllers, memory devices, application specific integrated circuits, and other types of integrated circuits. In embodiments represented by FIG. 8, IC 802 represents a processor and IC 804 represents a memory device. Processor 802 and memory device 804 communicate using address signals on lines 808, data signals on lines 810, and control signals on lines 820. In some embodiments, memory device 804 is implemented as memory device 100 (FIG. 1), lines 820 corresponding to lines 120, lines 808 corresponding to lines 108, and lines 810 corresponding to the combination of lines 161, 171, and 182.

System 800 of FIG. 8 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provide circuits and methods for operating a memory device at various speeds. The memory device has a first bi-directional data path and a second bi-directional data path. The first multiple bi-directional data path is configured to transfer data at a first speed. The second bi-directional data path is configured to transfer data at a second speed. The memory device has different modes. Depending on a certain mode, the memory device uses different combinations of the first and second bi-directional data paths to transfer data either at a single speed or at multiple speeds.

Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A device comprising:
   a memory array;
   a first data path connected to the memory array for transferring data at a first speed; and
   a second data path connected to the memory array for transferring data at a second speed.

2. The device of claim 1, wherein each of the first and second data paths is a bi-directional data path.

3. A device comprising:
   a memory array;
   a first data path connected to the memory array for transferring data at a first speed;
   a second data path connected to the memory array for transferring data at a second speed; and
   a strobe transceiver circuit connected to the first data path for transferring data to and from the first data path at the first speed, and connected to the second data path for transferring data to and from the second path at the second speed.

4. The device of claim 3 further comprising a data transceiver circuit connected to the second data path for transferring data to and from the second path at the second speed.

5. The device of claim 4, wherein each of the strobe and data transceiver circuits includes a plurality of transceivers, each of the transceivers in the strobe transceiver circuit having elements matching elements of each of the transceivers in the data transceiver circuit.

6. A device comprising:
   a memory array;
   a first data path connected to the memory array for transferring data at a first speed;
   a second data path connected to the memory array for transferring data at a second speed;
   a plurality of strobe transceivers connected to the first and second data paths for transferring data to and from the first data path at the first speed and for transferring data to and from the second data path at the second speed; and
   a plurality of data transceivers connected to the second data path for transferring data to and from the second path at the second speed.

7. The device of claim 6, wherein:
   the first data path is configured to transfer data to and from the memory array at the first speed in one mode; and
   the second data path is configured to transfer data to and from the memory array at the second speed in another mode.

8. The device of claim 6, wherein the first data path is configured to transfer data at the first speed in a test mode, and the second data path is configured to transfer data at the second speed in the test mode and in a normal mode.

9. The device of claim 6, wherein the plurality of strobe transceivers includes:
   a number of write strobe transceivers for receiving data from the first data path at the first speed and for providing write strobe signals to the second data path at the second speed; and
   a number of read strobe transceivers for providing data to the first data path at the first speed and for receiving read strobe signals from the second data path at the second speed.

10. The device of claim 6, wherein each of the strobe transceivers and each of the data transceivers have matching elements.

11. The device of claim 6, wherein each of the strobe transceivers and each of the data transceivers have equal number of elements.

12. A device comprising:
    a memory array;
    a first data path connected to the memory for transferring data at a first speed;
    a second data path connected to the memory array for transferring data at a second speed;
    a plurality data transceivers connected to the second data paths for transferring data to and from the memory array via the second data paths;
    a plurality write strobe transceivers connected to the first and second data paths for receiving data from the first data path in a test mode, and for providing write strobe signals to the second data path in one of the test mode and a normal mode; and
    a plurality read strobe transceivers connected to the first and second data paths for providing data to the first data path in the test mode, and for receiving read strobe signals from the second data path in one of the test mode and the normal mode.

13. The device of claim 12, wherein each of the write strobe transceivers is configured to receive data from the first data path at the first speed in a read operation in test mode.

14. The device of claim 13, wherein each of the write strobe transceivers is further configured to provide one of the write strobe signals to the second data path at the second speed in a write operation in the test mode.

15. The device of claim 13, wherein each of the write strobe transceivers is further configured to provide one of the write strobe signals to the second data path at the second speed in a write operation in a normal mode.

16. The device of claim 12, wherein each of the read strobe transceivers is configured to provide data to the first data path at the first speed in a write operation in a test mode.

17. The device of claim 16, wherein each of the read strobe transceivers is further configured to receive one of the read strobe signals from the second data path at the second speed in a read operation in a test mode.

18. The device of claim 16, wherein each of the read strobe transceivers is further configured to receive one of the read strobe signals from the second data path at the second speed in a read operation in a normal mode.

19. The device of claim 12, wherein each of the data transceivers is configured to provide data to the second data path at the second speed in a write operation of one in a test mode and a normal mode and configured to receive data from the second data path at the second speed in a read operation of one of the test mode and the normal mode.

20. The device of claim 12, wherein each of the write strobe transceivers, each of the read strobe transceivers, and each of the data transceivers have equal number of matching elements.

21. The device of claim 12, wherein each of the write strobe transceivers includes:
    an input circuit connected to the second data path; and
    an output circuit connected to the first data path.

22. The device of claim 21, wherein each of the read strobe transceivers includes:
    an input circuit connected to the first data path; and
    an output circuit connected to the second data path.

23. The device of claim 22, wherein each of the data transceivers includes:
    an input circuit connected to the second data path; and
    an output circuit connected to the second data path.

24. The device of claim 23, wherein the input circuits of the write strobe transceivers, read strobe transceivers, and data transceivers are identical.

25. The device of claim 24, wherein the output circuits of the write strobe transceivers, read strobe transceivers, and data transceivers are identical.

26. A device comprising:
    a memory array;
    a first bi-directional data path connected to the memory array;
    a second bi-directional data path connected to the memory array;
    a plurality of strobe transceivers connected to the first and second bi-directional data paths;
    a plurality of data transceivers connected to the second bi-directional data path; and
    a path selector connected between the memory array and the first and second bi-directional data paths for selecting one of the first and second bi-directional data paths for transferring data between the memory array and one of the first and second bi-directional data paths.

27. The device of claim 26, wherein the first bi-directional data path is configured to transfer data at a first speed.

28. The device of claim 27, wherein the second bi-directional data path is configured to transfer data at a second speed.

29. The device of claim 26, wherein the strobe transceivers are configured to transfer data to and from the first bi-directional data path at the first speed and to transfer data to and from the second bi-directional data path at the second speed.

30. The device of claim 29, wherein the data transceivers are configured to transfer data to and from the second bi-directional data path at the second speed.

31. The device of claim 30, wherein each of the strobe transceivers and each of the data transceivers have matching elements.

32. The device of claim 26, wherein the first bi-directional data path includes:
a data input/output circuit connected to the path selector;
an internal circuit; and
a select unit connected to the input/output circuit and the internal circuit for selecting a route to transfer data between the strobe transceivers and one of the input/output circuit and the internal circuit.

33. The device of claim 32, wherein the input/output circuit includes:
a plurality of input latches connected to the select unit for receiving data from the strobe transceivers based on a first combination of select signals; and
a plurality of output latches connected to the select unit for outputting data to the strobe transceivers based on a second combination of the select signals.

34. The device of claim 33, wherein the input/output circuit further includes a compression and decompression engine connected to the input and output latches for compressing data transferred from the input latches and for decompressing data transferred to the output latches.

35. The device of claim 32, wherein the internal circuit includes:
a control path connected to the select unit for receiving control data from the strobe transceivers based on a first combination of the select signals; and
a feedback path connected to the select unit for providing feedback data to the strobe transceivers based on a second combination of the select signals.

36. A device comprising:
a first data path and a second data path;
a first group of transceivers, each having an input circuit connected to the second data path and an output circuit connected to the first data path;
a second group of transceivers, each having an input circuit connected to the first data path and an output circuit connected to the second data path; and
a third group of transceivers, each having an input circuit connected to the second data path and an output circuit connected to the second data path.

37. The device of claim 36, wherein each transceiver of the first group of transceivers, each transceiver of the second group of transceivers, and each transceiver of the third group of transceivers have equal number of elements.

38. The device of claim 37, wherein each of the first and second data paths is a bi-directional data path.

39. The device of claim 36, wherein the input circuits of transceivers of the first, second, and third groups of transceivers are identical.

40. The device of 39, wherein the output circuits of transceivers of the first, second, and third groups of transceivers are identical.

41. The device of 36 further comprising a memory array connected to the first and second data path.

42. The device of claim 41, wherein the device further comprising a path selector connected in a path between the memory array and the first and second data paths.

43. The device of claim 42, wherein each of the first and second group of transceivers is configured to transferred data to and from the first data path at a first speed and configured to transferred data to and from the second data path at a second speed.

44. The device of claim 43, wherein the third group of transceivers is configured to transfer data to and from the second data path at the first speed.

45. A system comprising:
a processor; and
a memory device connected to the processor, the memory device including:
a memory array;
a first data path connected to the memory array and configured for transferring data at a first speed;
a second data path connected to the memory array and configured for transferring data at a second speed; and
a plurality of transceivers connected to the first and second data paths.

46. The system of claim 45, wherein each of the first and the second data paths is a bi-directional data path.

47. The system of claim 45, wherein the plurality of transceivers includes a plurality of strobe transceivers connected to the first data path for transferring data at the first speed, and connected to the second data path for transferring data at the second speed.

48. The system of claim 47, wherein the plurality of transceivers further includes a plurality of data transceivers connected to the second data path for transferring data at the second speed.

49. The system of claim 48, wherein the each of the plurality of strobe transceivers and each of the plurality data transceivers includes equal number of elements.

50. The system of claim 48, wherein the each of the plurality of strobe transceivers and each of the plurality of data transceivers includes matching elements.

* * * * *